United States Patent
Wang

(10) Patent No.: US 9,048,113 B2
(45) Date of Patent: Jun. 2, 2015

(54) COST-EFFECTIVE LED LIGHTING INSTRUMENT WITH GOOD LIGHT OUTPUT UNIFORMITY

(71) Applicant: TSMC Solid State Lighting Ltd., Hsinchu (TW)

(72) Inventor: Chih-Lin Wang, Hsin-Chu (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 0 days.

(21) Appl. No.: 14/181,938

(22) Filed: Feb. 17, 2014

(65) Prior Publication Data

US 2014/0159079 A1 Jun. 12, 2014

Related U.S. Application Data

(62) Division of application No. 13/307,066, filed on Nov. 30, 2011, now Pat. No. 8,680,544.

(51) Int. Cl.
| | |
|---|---|
| *H01L 33/00* | (2010.01) |
| *F21K 99/00* | (2010.01) |
| *F21S 6/00* | (2006.01) |
| *F21V 9/16* | (2006.01) |
| *H01L 25/075* | (2006.01) |
| *F21Y 101/02* | (2006.01) |
| *F21Y 105/00* | (2006.01) |

(52) U.S. Cl.
CPC .............. *H01L 25/0753* (2013.01); *F21K 9/00* (2013.01); *F21S 6/005* (2013.01); *F21V 9/16* (2013.01); *F21Y 2101/02* (2013.01); *F21Y 2105/003* (2013.01)

(58) Field of Classification Search
CPC .................. H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742
USPC ............... 257/12–13, 81, 84, 87–89, 98–100, 257/347–348, 433–434; 313/112, 501, 503, 313/506–507
See application file for complete search history.

(56) References Cited

U.S. PATENT DOCUMENTS

| | | | |
|---|---|---|---|
| 8,384,097 B2 | 2/2013 | Yan | |
| 2012/0262903 A1* | 10/2012 | Li et al. | 362/84 |
| 2013/0075769 A1 | 3/2013 | Yan et al. | |
| 2013/0093354 A1 | 4/2013 | Jiang | |

* cited by examiner

*Primary Examiner* — Dung A. Le
(74) *Attorney, Agent, or Firm* — Haynes and Boone, LLP

(57) ABSTRACT

A lighting instrument includes: a substrate; a plurality of first light-emitting diodes (LEDs) disposed over the substrate, wherein the first LEDs each have a first value range for a light output characteristic; a plurality of second LEDs disposed over the substrate, wherein the second LEDs each have a second value range for the light output characteristic, the second value range being different from the first value range; a phosphor layer located at a distance above the first LEDs and the second LEDs; and a light-reflective layer that is disposed on a surface of the phosphor layer; wherein the first LEDs interleave with the second LEDs according to a predefined pattern.

20 Claims, 6 Drawing Sheets

COST-EFFECTIVE LED LIGHTING INSTRUMENT WITH GOOD LIGHT OUTPUT UNIFORMITY

PRIORITY DATA

The present application is a divisional application of U.S. patent application Ser. No. 13/307,066, filed on Nov. 30, 2011, entitled "Cost-Effective LED Lighting Instrument with Good Light Output Uniformity", the disclosure of which is hereby incorporated by reference in its entirety.

TECHNICAL FIELD

The present disclosure relates generally to light-emitting devices, and more particularly, to a cost-effective light-emitting diode (LED) lighting instrument having improved light output uniformity.

BACKGROUND

LED devices are semiconductor photonic devices that emit light when a voltage is applied. LED devices have increasingly gained popularity due to favorable characteristics such as small device size, long lifetime, efficient energy consumption, and good durability and reliability. In recent years, LED devices have been deployed in various applications, including indicators, light sensors, traffic lights, broadband data transmission, back light unit for LCD displays, and illumination apparatuses. For example, LED devices are often used in illumination apparatuses provided to replace conventional incandescent light bulbs, such as those used in a typical lamp.

One of the performance criteria for LED illumination apparatuses is light output uniformity. For example, it is desired that the light output for an LED illumination apparatus maintain relatively uniform color and brightness throughout different areas of the LED illumination apparatus. However, existing LED illumination apparatuses often suffer from poor light output uniformity, or may require expensive fabrication costs to achieve sufficient light output uniformity.

Therefore, although existing LED illumination devices are generally adequate for their intended purposes, they have not been entirely satisfactory in every aspect. A low cost LED illumination apparatus having good light output uniformity continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not necessarily drawn to scale or according to the exact geometries. In fact, the dimensions of the various features may be arbitrarily increased or reduced for clarity of discussion.

SUMMARY

Figure 1:
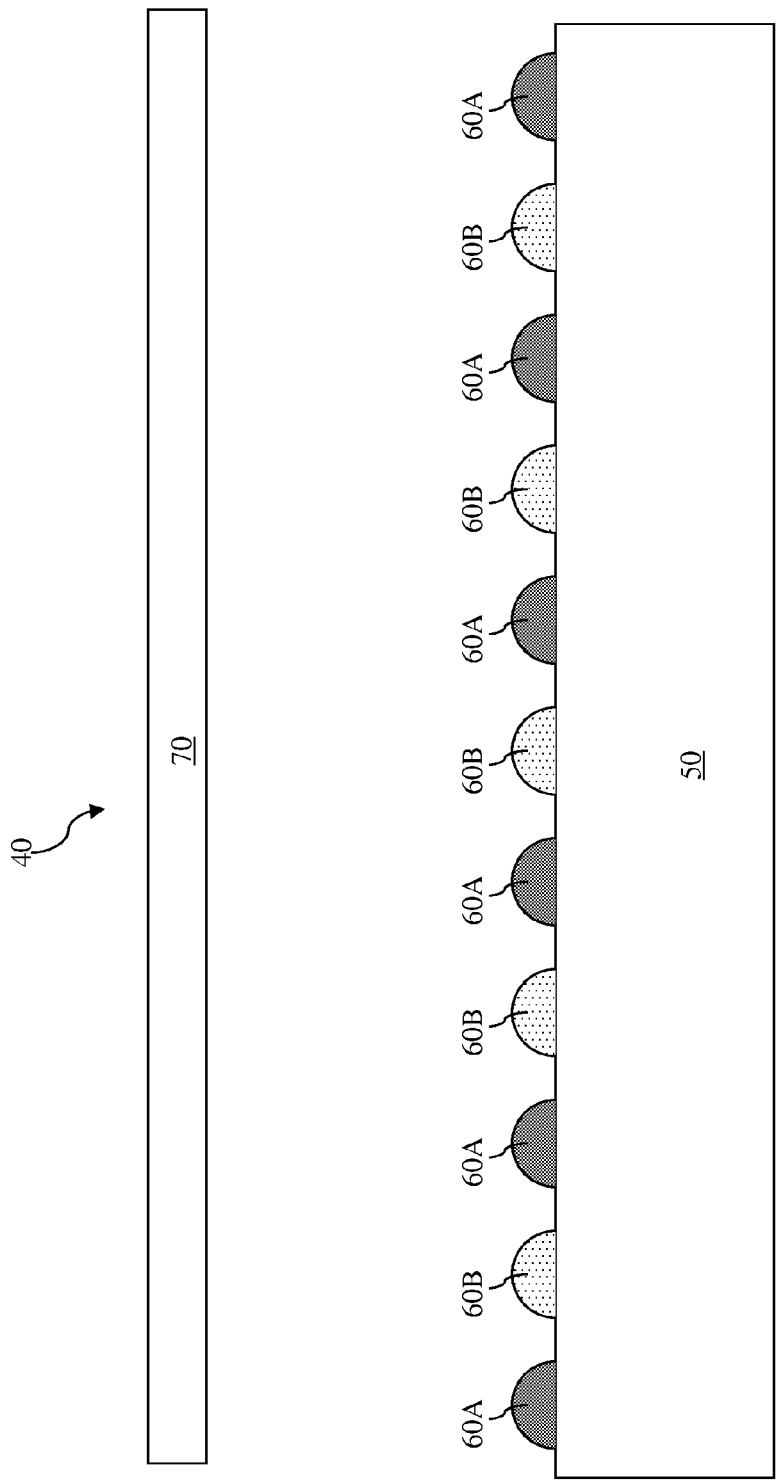
FIG. 1 is a diagrammatic fragmentary cross-sectional side view of an example lighting apparatus using a semiconductor photonic device as a light source according to various aspects of the present disclosure.

A lighting instrument includes: a substrate; a plurality of first light-emitting diodes (LEDs) disposed over the substrate, wherein the first LEDs each have a first value range for a light output characteristic; a plurality of second LEDs disposed over the substrate, wherein the second LEDs each have a second value range for the light output characteristic, the second value range being different from the first value range; a phosphor layer located at a distance above the first LEDs and the second LEDs; and a light-reflective layer that is disposed on a surface of the phosphor layer; wherein the first LEDs interleave with the second LEDs according to a predefined pattern.

In some embodiments, the light output performance includes performance with respect to light wavelength and performance with respect to light brightness; and each bin corresponds to a predefined range of light wavelength or a predefined range of light brightness.

In some embodiments, the predefined pattern includes light-emitting devices having alternating bins.

In some embodiments, the predefined pattern includes a multi-dimensional distribution.

In some embodiments, the predefined pattern is substantially symmetrical.

In some embodiments, the plurality of light-emitting devices is configured to be driven by a plurality of different currents; and light-emitting devices belonging to the same bin are driven by the same current.

In some embodiments, the apparatus further includes a phosphor layer disposed over the plurality of light-emitting devices, wherein the phosphor layer has a textured surface and/or diffuser particles disposed therein.

In some embodiments, the phosphor layer includes a plurality of different color phosphor components.

In some embodiments, the light-emitting devices each include a light-emitting diode (LED) die.

Another one of the broader forms of the present disclosure involves a lighting instrument. The lighting instrument includes: a substrate; and a plurality of lighting-emitting diode (LED) dies located on the substrate; wherein: the LED dies include LED dies from a plurality of bins; LED dies in one bin have substantially different performance regarding light wavelength or radiant flux than LED dies in other bins; and the LED dies are bin-mixed according to a sequenced pattern.

In some embodiments, the sequenced pattern includes interleaving bins of LED dies.

In some embodiments, the sequenced pattern is a one-dimensional pattern or a two-dimensional pattern; and the sequenced pattern is substantially symmetrical.

In some embodiments, the LED dies are operable to be driven by a plurality of different currents, each current driving the LED dies in a respective bin.

In some embodiments, the lighting instrument further includes a remote phosphor layer located over and spaced apart from the LED dies.

In some embodiments, the remote phosphor layer includes different color phosphor particles; the remote phosphor layer includes a roughened surface; the remote phosphor layer includes an anti-reflective coating; and the remote phosphor layer includes a plurality of diffuser particles.

In some embodiments, the lighting instrument further includes: a diffuser cap housing the LED dies therein; and a heat sink thermally coupled to the LED dies through the substrate.

Still another one of the broader forms of the present disclosure involves a lighting module. The lighting module includes: a first subset of light-emitting diode (LED) dies disposed on the board; a second subset of LED dies disposed on the board, wherein the first and second subsets of LED dies belong to different bins, respectively, and wherein the LED dies in the first subset are interleaved with the LED dies in the second subset according to a predefined pattern; and a remote phosphor layer disposed over the first and second subsets of LED dies.

In some embodiments, all the LED dies in the first subset are driven by a first current; and all the LED dies in the second subset are driven by a second current different from the first current.

In some embodiments, the predefined pattern is substantially symmetrical and spans in one or more dimensions.

In some embodiments, the remote phosphor layer has a roughened surface, contains a plurality of different types of phosphor particles, and is coated with an anti-reflective material.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Semiconductor devices can be used to make photonic devices, such as light-emitting diode (LED) devices. When turned on, LED devices may emit radiation such as different colors of light in a visible spectrum, as well as radiation with ultraviolet or infrared wavelengths. Compared to traditional light sources (e.g., incandescent light bulbs), lighting instruments using LED devices as light sources offer advantages such as smaller size, lower energy consumption, longer lifetime, variety of available colors, and greater durability and reliability. These advantages, as well as advancements in LED fabrication technologies that have made LED devices cheaper and more robust, have added to the growing popularity of LED-based lighting instruments in recent years.

Nevertheless, existing LED-based lighting instruments may face certain shortcomings. One such shortcoming pertains to poor light output uniformity. In more detail, LED devices may naturally deviate from one another in terms of light output color and/or brightness, even if they are manufactured from the same wafer and undergo the same fabrication processes. Since a typical LED lighting instrument may employ a plurality of LED devices, the LED lighting instrument may experience substantial variations in light output color and brightness, thereby having poor uniformity performance.

One approach attempts to overcome the poor uniformity issue by categorizing the LED devices into a plurality of bins, where each bin is associated with a particular performance range in terms of light output color and/or brightness. Afterwards, only LED devices from a certain bin or a certain subset of bins are implemented on the LED lighting instrument. However, this approach may result in many LED devices that do not meet proper binning requirements being discarded, even though these devices are otherwise functional. Consequently, this approach raises LED fabrication costs. Therefore, it is desirable to find a low cost LED lighting instrument that offers good light output uniformity.

According to various aspects of the present disclosure, described below is a cost-effective LED lighting instrument that substantially improves light output uniformity. Referring to FIG. 1, a diagrammatic fragmentary cross-sectional side view of a portion of a lighting instrument 40 is illustrated according to some embodiments of the present disclosure. The lighting instrument 40 includes a substrate 50. In some embodiments, the substrate 50 includes a Metal Core Printed Circuit Board (MCPCB). The MCPCB includes a metal base that may be made of Aluminum (or an alloy thereof). The MCPCB also includes a thermally conductive but electrically insulating dielectric layer disposed on the metal base. The MCPCB may also include a thin metal layer made of copper that is disposed on the dielectric layer. In certain embodiments, the substrate 50 may include other suitable thermally conductive structures. The substrate 50 may contain active circuitry and may also be used to establish interconnections.

The lighting instrument 40 includes a plurality of semiconductor photonic dies 60 located on the substrate 50. The semiconductor photonic dies function as light sources for the lighting instrument 40. The semiconductor photonic dies 60 are LED dies in the embodiments described below, and as such may be referred to as LED dies 60 in the following paragraphs. Each LED die 60 includes the semiconductor die itself as well as the gel covering the die.

The LED dies 60 each include two oppositely doped semiconductor layers. In one embodiment, the oppositely doped semiconductor layers each contain a "III-V" family (or group) compound. In more detail, a III-V family compound contains an element from a "III" family of the periodic table, and another element from a "V" family of the periodic table. For example, the III family elements may include Boron, Aluminum, Gallium, Indium, and Titanium, and the V family elements may include Nitrogen, Phosphorous, Arsenic, Antimony, and Bismuth. In the present embodiment, the oppositely doped semiconductor layers include a p-doped gallium nitride (GaN) material and an n-doped gallium nitride material, respectively. The p-type dopant may include Magnesium (Mg), and the n-type dopant may include Carbon (C) or Silicon (Si).

The LED dies 60 also each include a multiple-quantum well (MQW) layer that is disposed in between the oppositely doped layers. The MQW layer includes alternating (or periodic) layers of active material, such as gallium nitride and indium gallium nitride (InGaN). For example, the MQW layer may include a number of gallium nitride layers and a number of indium gallium nitride layers, wherein the gallium nitride layers and the indium gallium nitride layers are formed in an alternating or periodic manner. In one embodiment, the MQW layer includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency depends on the number of layers of alternating layers and thicknesses.

It is understood that each LED die may also include a pre-strained layer and an electron-blocking layer. The pre-strained layer may be doped and may serve to release strain and reduce a Quantum-Confined Stark Effect (QCSE)—describing the effect of an external electric field upon the light absorption spectrum of a quantum well—in the MQW layer. The electron blocking layer may include a doped aluminum gallium nitride (AlGaN) material, wherein the dopant may include Magnesium. The electron blocking layer helps confine electron-hole carrier recombination to within the MQW layer, which may improve the quantum efficiency of the MQW layer and reduce radiation in undesired bandwidths.

The doped layers and the MQW layer may all be formed by an epitaxial growth process known in the art. After the completion of the epitaxial growth process, an LED is created by the disposition of the MQW layer between the doped layers. When an electrical voltage (or electrical charge) is applied to the doped layers of the LED devices 60, the MQW layer emits radiation such as light. The color of the light emitted by the MQW layer corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer. The LED dies 60 may also include electrodes or contacts that allow the LED dies 60 to be electrically coupled to external devices.

The LED dies 60 include LED dies from different bins. As discussed above, in LED fabrication, the performance of LED dies may vary from one another. As examples, the light output of one die may have a slightly different color than that of another die, or may be slightly brighter or dimmer than that of another die. As a part of fabrication, the LED dies are tested for these performance characteristics and separated into different bins accordingly.

For instance, suppose all the LED dies are manufactured as blue emitter LED dies that should output blue light. In some embodiments, blue light may be defined as light having a wavelength ranging from about 440 nanometers (nm) to about 492 nm. In reality, the fabricated LED dies may mostly fall within this range, but some of the LED dies may fall outside of the range. Furthermore, even the LED dies falling within this range may have different wavelengths from one another. Thus, the LED dies having an output wavelength between 455 nm to 467 nm may be categorized as bin 1 dies; LED dies having an output wavelength between 468 nm to 480 nm may be categorized as bin 2 dies; LED dies having an output wavelength between 481 nm to 492 nm may be categorized as bin 3 dies; LED dies having an output wavelength less than 455 nm may be categorized as bin 4 dies; and LED dies having an output wavelength greater than 492 nm may be categorized as bin 5 dies. Though five bins are used in the above example, any other number of bins may be used in various embodiments. Similarly, the LED dies may be binned according to their respective performance levels with respect to other light output light characteristics such as brightness or radiant flux.

According to certain traditional LED fabrication methods, only LED dies in one (or a small selected subset) of the bins is used for an LED lighting instrument to ensure its output uniformity. However, such approach may require the LED dies in unselected bins to be discarded, even if these LED dies are otherwise functional. Hence, this approach leads to unnecessary waste and higher fabrication costs.

In comparison, the present disclosure utilizes a controlled bin-mixing approach to ensure the output uniformity of the lighting instrument. In more detail, LED dies from multiple bins are implemented on the lighting instrument according to a predefined orderly pattern, for example, an interleaving pattern. Using FIG. 1 as an example, the LED dies on the substrate 50 include LED dies 60A that belong to bin A, and LED dies 60B that belong to bin B. Bin A and bin B may be differentiated based on one or more of the light output characteristics discussed above, such as wavelength, radiant flux, etc. As shown in FIG. 1, the LED dies 60A and LED dies 60B are disposed in an interleaving or alternating manner. In certain embodiments, each LED die is adjacently disposed to an LED die of a different bin type.

In some embodiments, LED dies 60A may have longer wavelengths than the LED dies 60B, though their respective radiant flux may be approximately the same. Thus, the light output generated by the LED dies 60A may be slightly less blue than the light generated by the LED dies 60B. Nevertheless, the interleaving distribution of the bins (bin A and bin B) has an "averaging" type of effect on the overall light output to a human observer. In other words, since the LED dies 60A and 60B are relatively small, the human eye likely cannot distinguish the light generated by each LED die individually. Instead, the human observer will likely see a light having a more "uniform" blueness level (more blue than LED dies 60A but less blue than LED dies 60B). In this manner, a desired uniform color temperature can be achieved by bin-mixing LED dies from different bins having different wavelengths.

In some other embodiments, the LED dies 60A may have greater radiant flux than the LED dies 60B, though their respective wavelengths may be approximately the same. Thus, the light output generated by the LED dies 60A may be slightly brighter than the light generated by the LED dies 60B. Similar to the embodiment discussed above, the interleaving nature of the bins allows the human eye to ignore the brightness variations. Instead, the human observer will likely see a light having a "uniform" brightness level (brighter than LED dies 60B but less bright than LED dies 60A).

In other embodiments, more than two bins may be used. For example, if four bins A, B, C, D are used, then the bin distribution may follow a pattern of A-B-C-D-A-B-C-D . . . , or any other suitable distribution pattern. Furthermore, the LED dies in a given bin may have variances from one another with respect to multiple performance criteria. For example, in some embodiments, LED dies 60A in bin A may have a longer wavelength and a greater radiant flux (or longer wavelength and smaller radiant flux, or shorter wavelength and greater radiant flux, or shorter wavelength and smaller radiant flux) than the LED dies 60B in bin B. Regardless of the specific binning classification, the end result of a proper bin-mixing approach according to the present disclosure is that the light output of the lighting instrument 40 can achieve greater uniformity than if the LED dies are randomly distributed without taking the binning information into consideration.

Figure 2B:
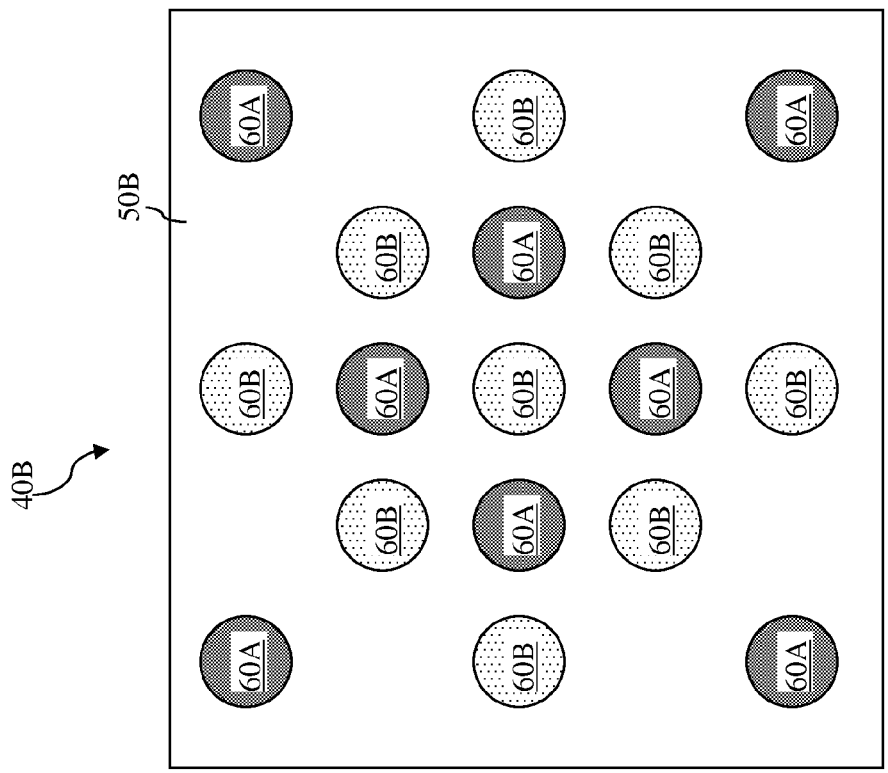
FIGS. 2A-2B are diagrammatic fragmentary top views of a plurality of photonic devices disposed on a substrate according to various aspects of the present disclosure.
Figure 2A:
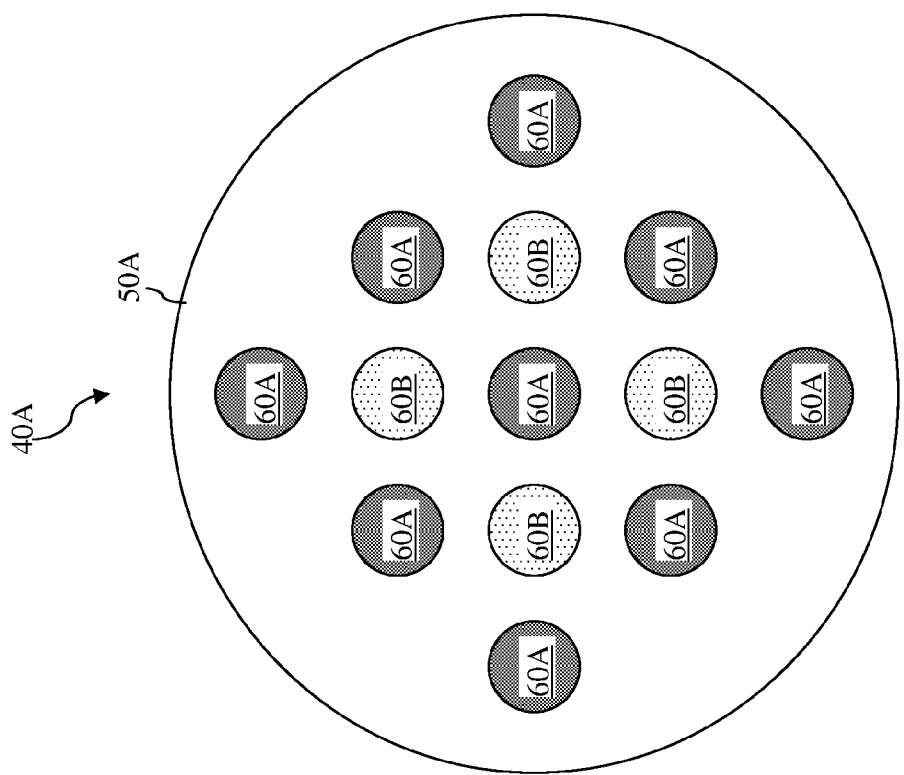

The LED dies 60 may also be distributed in a multi-dimensional manner. For example, FIGS. 2A and 2B illustrate top views of lighting instruments 40A and 40B according to various aspects of the present disclosure. In more detail, the lighting instruments 40A and 40B each contain a plurality of LED dies disposed on substrates 50A and 50B, respectively. The substrates may have different shapes and/or dimensions. For example, the substrate 50A has a substantially circular shape, and the substrate 50B has a substantially rectangular shape. In other embodiments, the substrate 50 may have other suitable shapes such as triangular shapes, square shapes, or other polygonal shapes.

In FIGS. 2A and 2B, the LED dies 60 are distributed two-dimensionally and form a plurality of rows (or columns). Within each row or column, each LED die may be disposed adjacently to another LED die of a different bin type. In other words, LED dies 60A (belonging to bin A) interleave with the LED dies 60B (belonging to bin B). In other embodiments, two or more LED dies of the same bin type can be disposed adjacent to each other in certain areas. Stated differently, though LED dies from different bins are interleaved with one another, the interleaving need not be on a one-to-one basis. For example, two LED dies from bin A may be collectively interleaved with two LED dies from bin B, forming a bin distribution pattern of A-A-B-B-A-A-B-B. In fact, the present disclosure allows for subsets of LED dies 60 to be distributed according to an ordered predefined pattern, where each subset of LED dies 60 may include one or more LED dies from the same bin. Also, the LED dies 60 in the illustrated embodiments are symmetrically distributed. The symmetrical distribution pattern helps the lighting instruments 40A-40B achieve better uniformity for the light output. However, alternative embodiments may employ a non-symmetrical distribution pattern as well.

In further embodiments, the LED dies 60 may be distributed in a three-dimensional manner. For example, the LED dies 60 may be located on a surface that is not flat. Also, the predefined pattern of the LED dies 60 is not restricted to those shown in FIGS. 1-2. Any other suitable pattern may be employed in different embodiments to satisfy design requirements and manufacturing concerns.

Referring back to FIG. 1, the LED dies 60 from different bins are driven by different currents. For example, the LED dies 60A in bin A are driven by one current source A (not illustrated), and the LED dies 60B in bin B are driven by another current source B (not illustrated). In traditional devices using LED dies from a single bin, only one current is used to drive the LED dies. In comparison, the present disclosure allows for multiple different currents to be used to drive LED dies from different bins. Therefore, by properly controlling the currents, the overall color temperature of the light output of the lighting instrument 40 may be adjusted.

The lighting instrument 40 also includes a phosphor layer 70. In the embodiment illustrated, the phosphor layer 70 is a remote phosphor layer located above and away from the LED dies 60. The phosphor layer 70 may include either phosphorescent materials and/or fluorescent materials. In practical LED applications, the phosphor layer 70 may be used to transform the color of the light emitted by an LED dies 60. For example, the phosphor layer 70 can transform a blue light emitted by an LED die 60 into a different wavelength light. By changing the material composition of the phosphor layer 70, the desired light color (e.g., white) emitted by the LED die 60 may be achieved. In certain alternative embodiments, the phosphor layer 70 may be coated on the surfaces of the LED dies 60 in a concentrated viscous fluid medium (e.g., liquid glue). As the viscous liquid sets or cures, the phosphor material becomes a part of the LED package.

FIGS. 3A-3D are diagrammatic cross-sectional side views of other embodiments of the phosphor layer 70. In the embodiments illustrated in FIG. 3A, the phosphor layer 70 includes a textured top surface 80. For example, the textured surface 80 may be roughened to help scatter the light emitted by the LED dies 60, which makes their light output more uniform. In more detail, it would be undesirable to have a light output that is very intense (bright) in some directions or spots and weak (dim) in other directions or spots. The textured surface 80 of the phosphor layer 70 allows incident light to be reflected in a plurality of different directions. Consequently, the result is that the light output is less likely to contain spots having varying degrees of brightness—thereby improving light output uniformity. In addition, an anti-reflective coating 85 may be disposed on a bottom surface of the phosphor layer 70. The anti-reflective coating 85 reduces the reflection of light, thereby improving the efficiency of the LED dies.

Figure 3A:
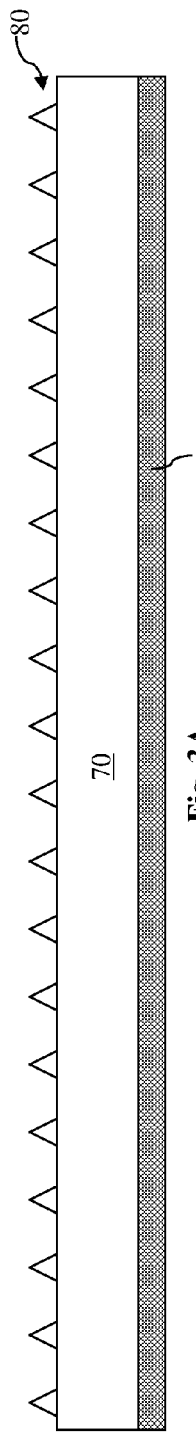
FIGS. 3A-3D are diagrammatic fragmentary cross-sectional side views of different embodiments of a phosphor layer according to various aspects of the present disclosure.
Figure 3B:
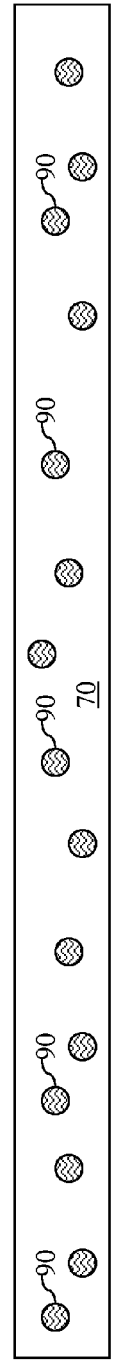

In the embodiments illustrated in FIG. 3B, the phosphor layer 70 contains a plurality of phosphor particles 90 corresponding to a different color. For example, the phosphor layer 70 may be a yellow phosphor layer, which can convert a blue light generated by the LED dies 60 into a yellow light. The yellow light may mix with the blue light to produce a white light. Here, the phosphor particles 90 may be red phosphor particles, which are mixed in the phosphor layer 70. The red phosphor particles 90 can convert the blue light into a red light. The red light may mix with the blue light and the yellow light to produce a white light.

Figure 3C:
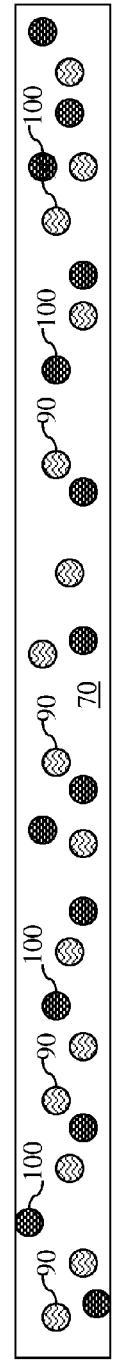

In the embodiments illustrated in FIG. 3C, the phosphor layer 70 further contains phosphor particles 100 in addition to phosphor particles 90. The phosphor particles 100 are different color phosphor particles than either the phosphor layer 70 or the phosphor particles 90. For example, the phosphor particles 100 may be green phosphor particles that can convert the blue light into green light. The blue, green, yellow, and red lights may be mixed together to obtain a white light.

Figure 3D:
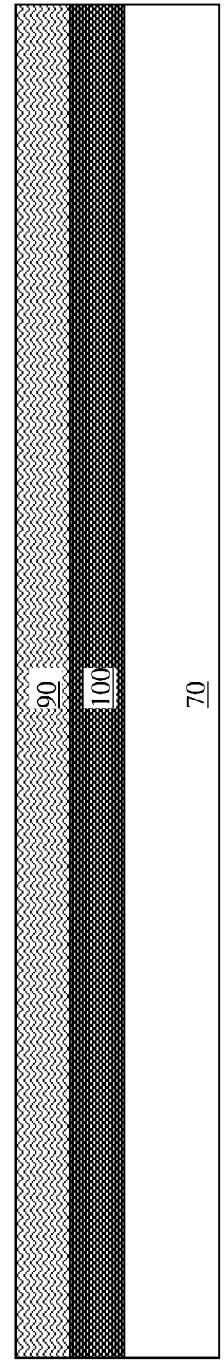

In the embodiments illustrated in FIG. 3D, a phosphor layer 90 (containing phosphor particles 90) is formed on a phosphor layer 100 (containing phosphor particles 100), which is then formed on the phosphor layer 70. In other words, instead of having a single phosphor layer having other types of phosphor particles mixed therein, the embodiments illustrated in FIG. 3D uses several different phosphor layers to perform light color conversion.

Though the examples discussed above correspond the phosphor particles 70, 90, and 100 to yellow, red, and green colors, respectively, the phosphor particles 70, 90, and 100 may correspond to other colors in alternative embodiments. In addition, the embodiments discussed above may also contain diffuser particles to enhance color uniformity. These diffuser particles may include $TiO_2$, $SiO_2$, or other suitable diffuser particles for scattering light. Furthermore, various aspects of the embodiments in FIGS. 3A-3D may be combined in other embodiments. For example, a phosphor layer may contain some different color phosphor particles therein as well as having another color phosphor layer formed thereon (or therebelow), and that phosphor layer may also have a textured surface and/or an anti-reflection coating.

Figure 4:
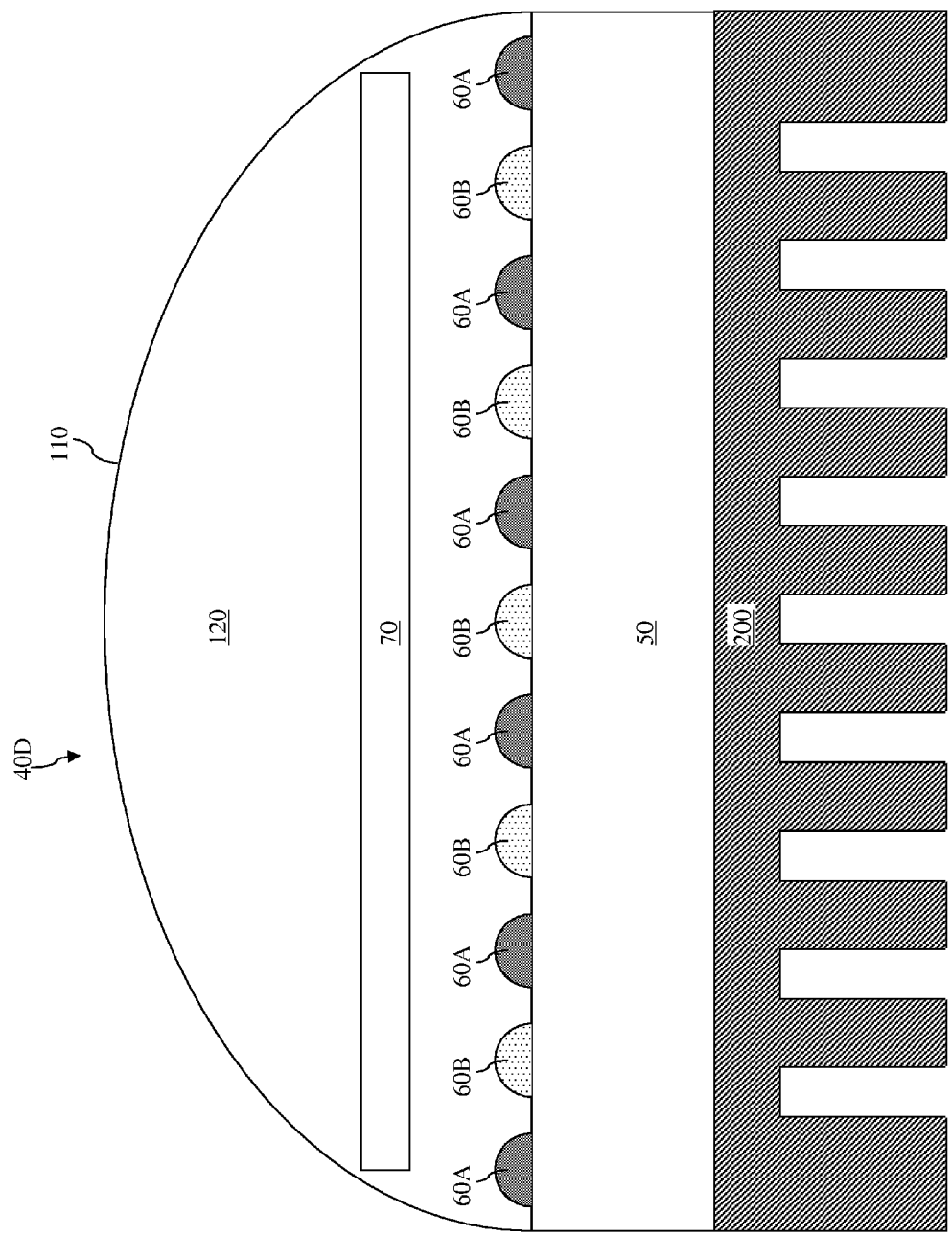
FIG. 4 is a diagrammatic fragmentary cross-sectional side view of an example lighting apparatus using a semiconductor photonic device as a light source according to various aspects of the present disclosure.

Referring now to FIG. 4, a diagrammatic cross-sectional side view of another embodiment of the lighting instrument 40D is illustrated. The lighting instrument 40D includes a plurality of LED dies 60 disposed on a substrate 50. The LED dies are bin-mixed in a similar manner as discussed above for better output uniformity. A remote phosphor layer 70 is disposed over the LED dies 60. The lighting instrument 40D also includes a diffuser cap 110. The diffuser cap 110 provides a cover for the LED dies 60 therebelow. Stated differently, the LED dies 60 may be encapsulated by the diffuser cap 110 and the substrate 50 collectively. In some embodiments, the diffuser cap 110 has a curved surface or profile. In some embodiments, the curved surface may substantially follow the contours of a semicircle, so that each beam of light emitted by the LED dies 60 may reach the surface of the diffuser cap 110 at a substantially right incident angle, for example, within a few degrees of 90 degrees. The curved shape of the diffuser cap 110 helps reduce Total Internal Reflection (TIR) of the light emitted by the LED dies 60. In some embodiments, the diffuser cap 110 has a textured surface for further scattering of the incident light.

In some embodiments, a space 120 between the LED dies 60 and the diffuser cap 110 is filled by air. In another embodiment, the space 120 may be filled by an optical-grade silicone-based adhesive material, also referred to as an optical gel. Phosphor particles may be mixed within the optical gel in that embodiment so as to further diffuse light emitted by the LED dies 60.

The substrate 50 is located on a thermal dissipation structure 200, also referred to as a heat sink 200. The heat sink 200 is thermally coupled to the LED dies 60 through the silicon substrate 50. The heat sink 200 is configured to facilitate heat dissipation to the ambient atmosphere. The heat sink 200 contains a thermally conductive material, such as a metal material. The shape and geometries of the heat sink 200 may be designed to provide a framework for a familiar light bulb while at the same time spreading or directing heat away from the LED dies 60. To enhance heat transfer, the heat sink 200 may have a plurality of fins that protrude outwardly from a body of the heat sink 200. The fins may have substantial surface area exposed to ambient atmosphere to facilitate heat transfer. In some embodiments, a thermally conductive material may be disposed between the substrate 50 and the heat sink 200. For example, the thermally conductive material may include thermal grease, metal pads, solder, etc. The thermally conductive material further enhances heat transfer from the LED dies 60 to the heat sink 200.

Figure 5:
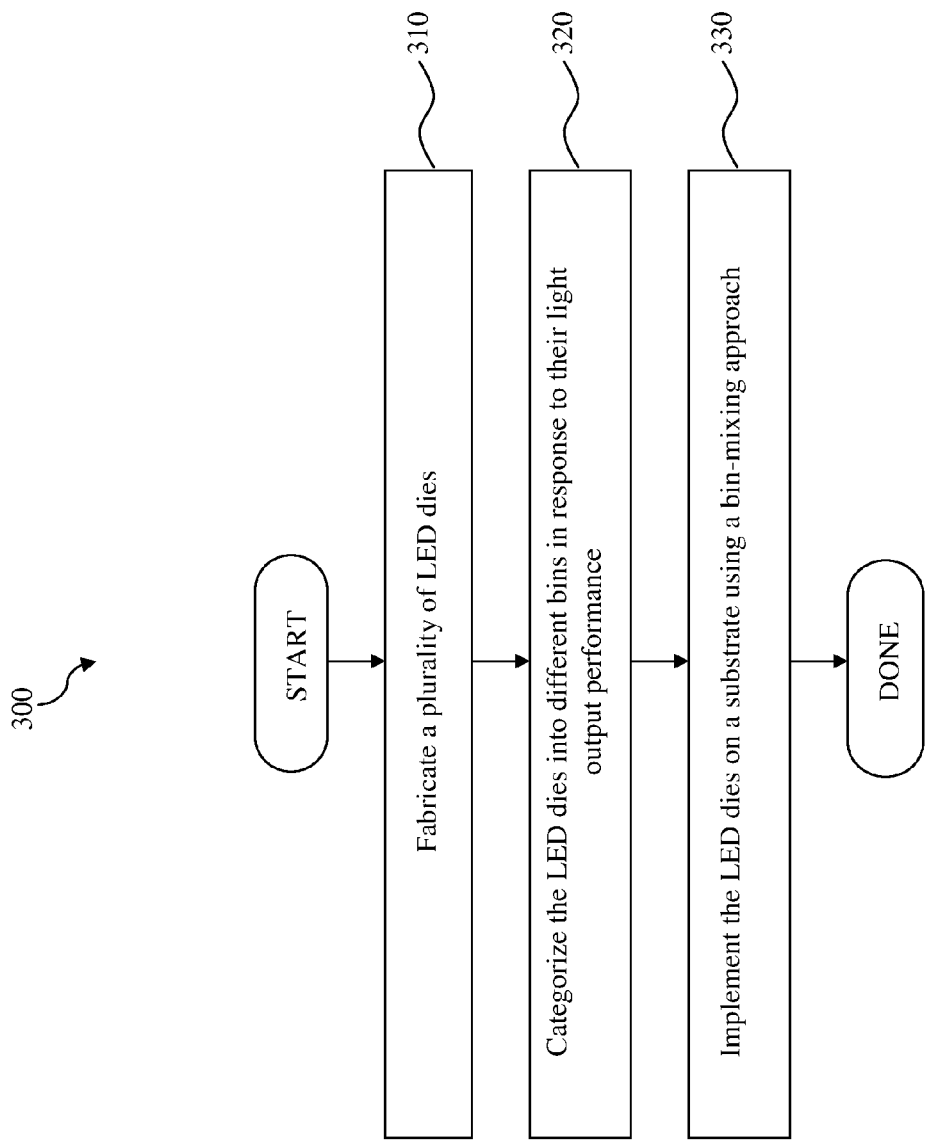
FIG. 5 is a flowchart illustrating a method of fabricating a lighting apparatus using a semiconductor photonic device as a light source according to various aspects of the present disclosure.

FIG. 5 is a flowchart of a method 300 for fabricating a lighting apparatus using a semiconductor photonic device as a light source according to various aspects of the present disclosure. The method 300 includes a block 310, in which a plurality of LED dies is fabricated. The method 300 includes a block 320, in which the LED dies are categorized into different bins in response to their light output performance. In some embodiments, the bins may involve light output wavelength or radiant flux. The LED dies in each bin have relatively close values in terms of light wavelength and/or radiant flux, but these values are substantially different from values for LED dies in a different bin. The method 300 includes a block 330, in which the LED dies are implemented on a substrate using a bin-mixing approach. In some embodiments, the bin-mixing approach involves placing the LED dies on the substrate according to a sequenced pattern. The pattern may involve interleaved LED dies from different bins. The pattern may also be substantially symmetrical. Additional processes may be performed before, during, or after the blocks 310-330 discussed herein to complete the fabrication of the lighting apparatus. For the sake of simplicity, these additional processes are not discussed herein.

The lighting instrument according to the embodiments disclosed herein offers advantages over existing semiconductor-based lighting products. It is understood, however, that not all advantages are necessarily discussed herein, and different embodiments may offer additional advantages, and that no particular advantage is necessarily required for all embodiments.

One of the advantages is that a more uniform light output can be obtained. The orderly mixing of LED dies from different bins ensures that the collective light output will be substantially free of drastic variations (e.g., variations in terms of color or brightness). Consequently, the light output uniformity is improved. Another advantage is that the lighting instrument discussed herein is able to offer improved output uniformity while not increasing the costs of fabrication. Compared to traditional lighting instruments resorting to the use of a single LED bin to ensure light output uniformity, the lighting instrument herein is able to utilize a plurality of LED bins. Thus, the implementation of the lighting instrument herein involves reduces waste, since many previously-discarded LED bins can now be used.

Figure 6:
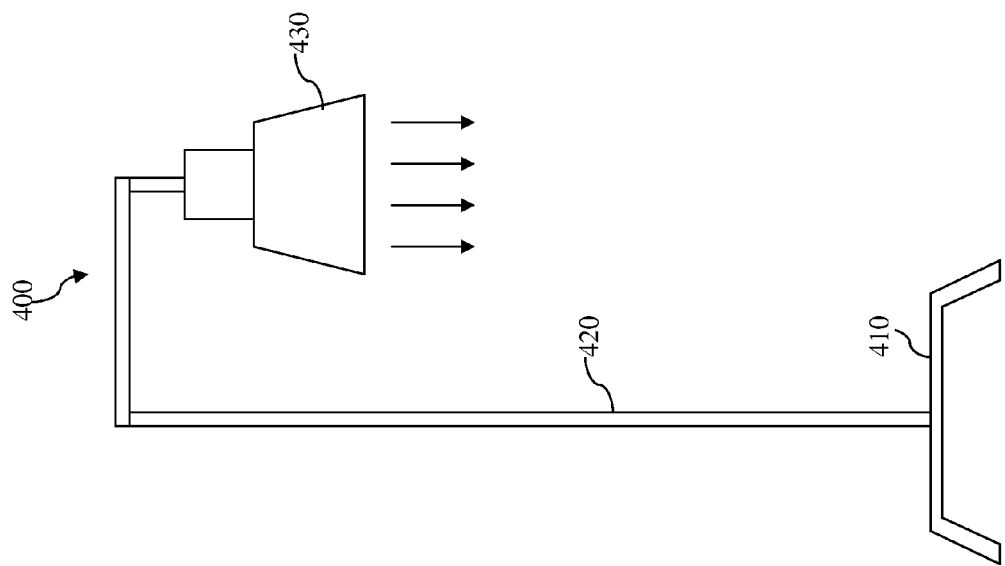
FIG. 6 is a diagrammatic view of a lighting module that includes a photonic lighting apparatus of FIGS. 1-4 according to various aspects of the present disclosure.

FIG. 6 illustrates a simplified diagrammatic view of a lighting module 400 that includes some embodiments of the lighting instrument 40 discussed above. The lighting module 400 has a base 410, a body 420 attached to the base 410, and a lamp 430 attached to the body 420. In some embodiments, the lamp 430 is a down lamp (or a down light lighting module).

The lamp 430 includes the lighting instrument 40 discussed above with reference to FIGS. 1-5. In other words, the lamp 430 of the lighting module 400 includes an LED-based light source, wherein the LED dies are bin-mixed according to a predefined patterned. Due at least in part to the advantages discussed above, the LED packaging for the lamp 430 is operable to produce a uniform light output at a low cost compared to traditional LED lighting instruments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lighting instrument, comprising:
   a substrate;
   a plurality of first light-emitting diodes (LEDs) disposed over the substrate, wherein the first LEDs each have a first value range for a light output characteristic;
   a plurality of second LEDs disposed over the substrate, wherein the second LEDs each have a second value range for the light output characteristic, the second value range being different from the first value range;
   a phosphor layer located at a distance above the first LEDs and the second LEDs; and
   a light-reflective layer that is disposed on a surface of the phosphor layer;
   wherein the first LEDs interleave with the second LEDs according to a predefined pattern.

2. The lighting instrument of claim 1, wherein the phosphor layer has a roughened surface.

3. The lighting instrument of claim 1, wherein the phosphor layer contains phosphor particles corresponding to a plurality of different colors.

4. The lighting instrument of claim 1, wherein the phosphor layer contains light-scattering particles.

5. The lighting instrument of claim 1, wherein the light output characteristic includes wavelength or radiant flux.

6. The lighting instrument of claim 1, wherein:
the first LEDs belong to a first bin; and
the second LEDs belong to a second bin different from the first bin.

7. The lighting instrument of claim 1, further comprising: a plurality of third LEDs disposed over the substrate, wherein the third LEDs each have a third value range for the light output characteristic, the third value range being different from the first value range and the second value range, and wherein the third LEDs interleave with the first and second LEDs according to a predefined pattern.

8. The lighting instrument of claim 1, wherein the first LEDs are driven by a first current source, and the second LEDs are driven by a second current source different from the first current source.

9. The lighting instrument of claim 1, wherein:
the first LEDs each have a output wavelength between 455 nanometers and 467 nanometers; and
the second LEDs each have a output wavelength greater than 492 nanometers or less than 455 nanometers.

10. The lighting instrument of claim 1, wherein the predefined pattern is a two dimensional pattern that includes a plurality of rows and a plurality of columns, wherein the rows and columns are made up of the first and second LEDs.

11. The lighting instrument of claim 10, wherein according to the predefined pattern, within each row or each column, each first LED is adjacently located to a respective one of the second LEDs.

12. The lighting instrument of claim 1, wherein the predefined pattern is a three dimensional pattern.

13. A lighting instrument, comprising:
a substrate;
a plurality of first light-emitting diodes (LEDs) disposed over the substrate, wherein the first LEDs each belong to a first bin;
a plurality of second LEDs disposed over the substrate, wherein the second LEDs each belong to a second bin;
a phosphor layer located over the first LEDs and the second LEDs, wherein the phosphor layer contains light-scattering particles; and
a light-reflective layer that is disposed on a surface of the phosphor layer;
wherein:
the first and second bins have different wavelengths or radiant fluxes; and
the first LEDs interleave with the second LEDs in a one dimensional manner, or a two dimensional manner, or a three dimensional manner.

14. The lighting instrument of claim 13, wherein the phosphor layer has a roughened surface.

15. The lighting instrument of claim 13, wherein the phosphor layer contains phosphor particles corresponding to a plurality of different colors.

16. The lighting instrument of claim 13, further comprising: a plurality of third LEDs disposed over the substrate, wherein the third LEDs each belong to a third bin that has different wavelengths or radiant fluxes from the first and second bins, and wherein the third LEDs interleave with the first and second LEDs.

17. The lighting instrument of claim 13, wherein the first LEDs are driven by a first current source, and the second LEDs are driven by a second current source different from the first current source.

18. The lighting instrument of claim 13, wherein the first and second LEDs collectively make up a plurality of rows and a plurality of columns, and wherein within each row or each column, each first LED is adjacently located to a respective one of the second LEDs.

19. A lighting instrument, comprising:
a substrate;
a plurality of first light-emitting diodes (LEDs) disposed over the substrate, wherein the first LEDs each belong to a first bin;
a plurality of second LEDs disposed over the substrate, wherein the second LEDs each belong to a second bin having a different wavelength or different radiant fluxes from the first bin;
a phosphor layer located over the first LEDs and the second LEDs, wherein the phosphor layer contains light-scattering particles; and
a light-reflective layer that is disposed on a surface of the phosphor layer;
wherein the first LEDs interleave with the second LEDs in a two dimensional manner such that the first and second LEDs collectively make up a plurality of rows and a plurality of columns, and wherein within each row or each column, each LED is adjacently disposed to another LED from a different bin.

20. The lighting instrument of claim 19, wherein the phosphor layer has a roughened surface and contains phosphor particles corresponding to a plurality of different colors.

* * * * *